(12) United States Patent
Tomioka

(10) Patent No.: US 8,987,007 B2
(45) Date of Patent: Mar. 24, 2015

(54) METHOD OF MANUFACTURING A SEMICONDUCTOR DEVICE HAVING A MAGNETIC FILM USING PLASMA ETCHING

(71) Applicant: Kabushiki Kaisha Toshiba, Minato-ku, Tokyo (JP)

(72) Inventor: Kazuhiro Tomioka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/026,397

(22) Filed: Sep. 13, 2013

(65) Prior Publication Data

US 2014/0087485 A1    Mar. 27, 2014

(30) Foreign Application Priority Data

Sep. 21, 2012 (JP) ................. 2012-208670

(51) Int. Cl.
*H01L 21/00* (2006.01)
*H01L 43/12* (2006.01)
(52) U.S. Cl.
CPC ..................................... *H01L 43/12* (2013.01)
USPC ............................................................. 438/3
(58) Field of Classification Search
None
See application file for complete search history.

(56) References Cited

U.S. PATENT DOCUMENTS

| | | | | |
|---|---|---|---|---|
| 6,315,819 | B1 * | 11/2001 | Tokushima | ........................ 96/2 |
| 2005/0094315 | A1 * | 5/2005 | Payne et al. | ................... 360/125 |
| 2006/0245116 | A1 * | 11/2006 | Klostermann et al. | ..... 360/324.2 |
| 2009/0314740 | A1 * | 12/2009 | Ikemoto et al. | .................. 216/22 |
| 2011/0094875 | A1 | 4/2011 | Djayaprawira et al. | |
| 2011/0141796 | A1 * | 6/2011 | Lee et al. | ....................... 365/158 |
| 2012/0068285 | A1 * | 3/2012 | Kitagawa et al. | ............. 257/421 |
| 2012/0244639 | A1 * | 9/2012 | Ohsawa et al. | ................... 438/3 |
| 2012/0261777 | A1 * | 10/2012 | Shukh | ........................... 257/421 |
| 2013/0228883 | A1 | 9/2013 | Yuasa | |

FOREIGN PATENT DOCUMENTS

| | | |
|---|---|---|
| JP | 7-130572 | 5/1995 |
| JP | 8-253881 | 10/1996 |
| JP | 10-150044 | 6/1998 |
| JP | 2005-268349 | 9/2005 |
| JP | 2006-278457 | 10/2006 |

OTHER PUBLICATIONS

Hayakawa et al., "Dependence of Giant Tunnel Magnetoresistance of Sputtered CoFeB/MgO/CoFeB Magnetic Tunnel Junctions on MgO Barrier Thickness and Annealing Temperature," Japanese Journal of Applied Physics (2005), 44:L587-L589.

* cited by examiner

*Primary Examiner* — Charles Garber
*Assistant Examiner* — Brigitte Paterson
(74) *Attorney, Agent, or Firm* — Finnegan, Henderson, Farabow, Garrett & Dunner, LLP

(57) ABSTRACT

According to one embodiment, a method for manufacturing a semiconductor device is disclosed. The method includes forming a first magnetic film containing boron, forming a second magnetic film free from boron, above the first magnetic film. The method further includes selectively etching the second magnetic film with respect to the first magnetic film using plasma of etching gas which contains oxygen and hydrogen and which is free from halogen.

19 Claims, 5 Drawing Sheets

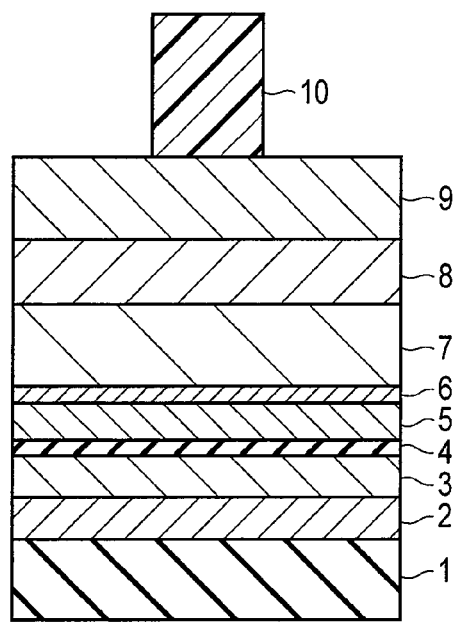
F I G. 1
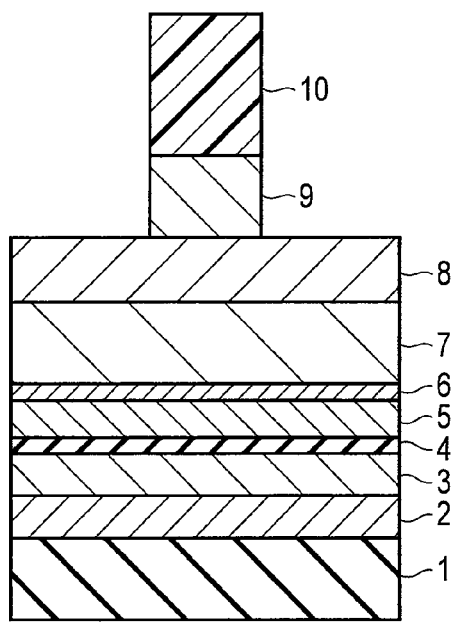
F I G. 2

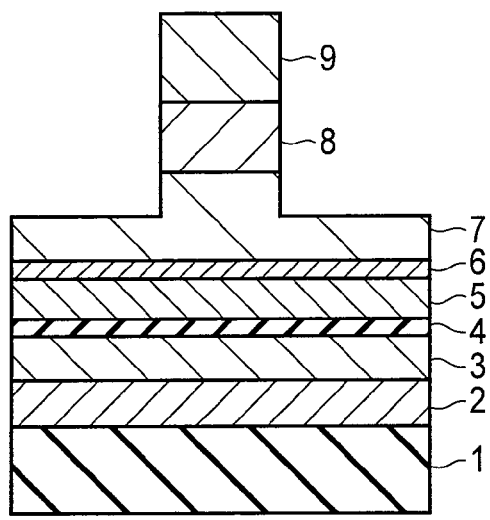
F I G. 3
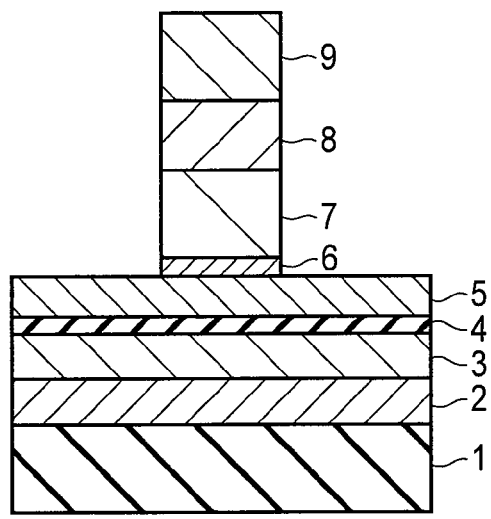
F I G. 4

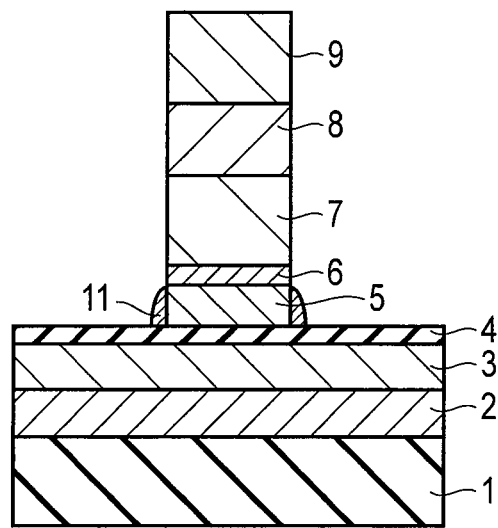
F I G. 5
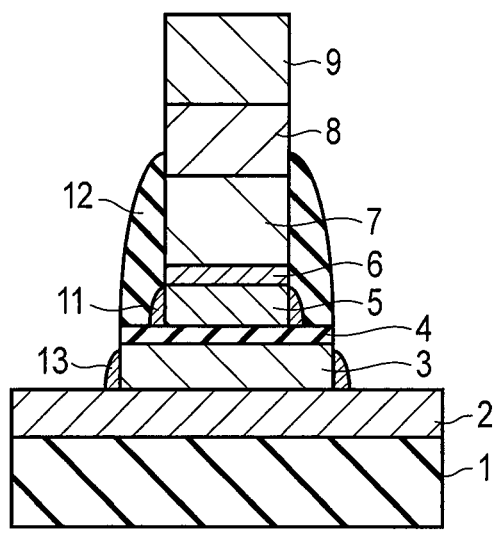
F I G. 6

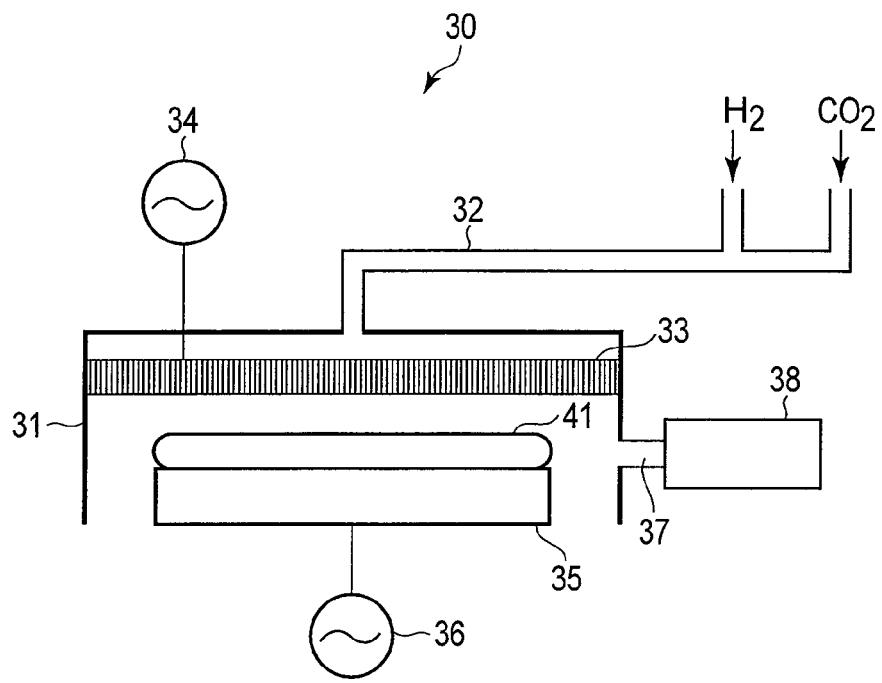
F I G. 7
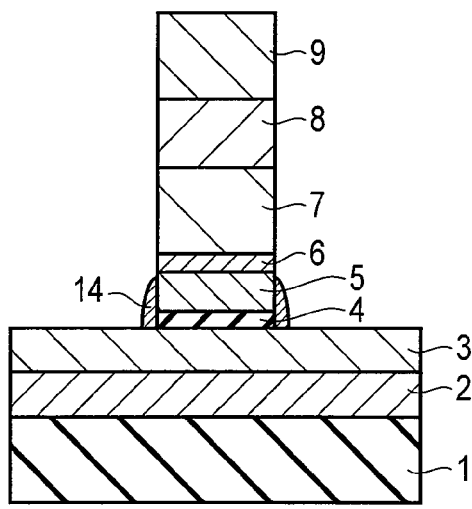
F I G. 8

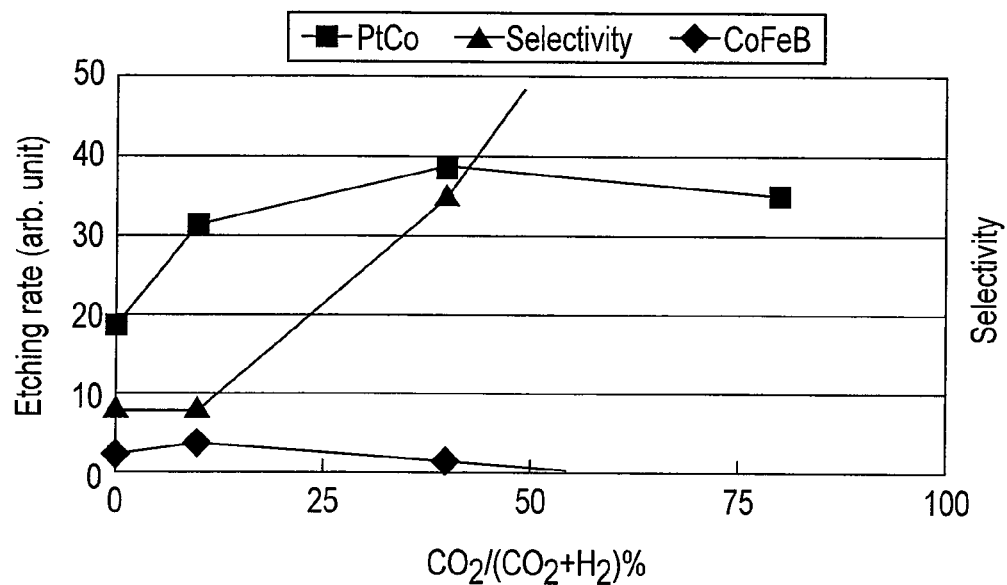
F I G. 9
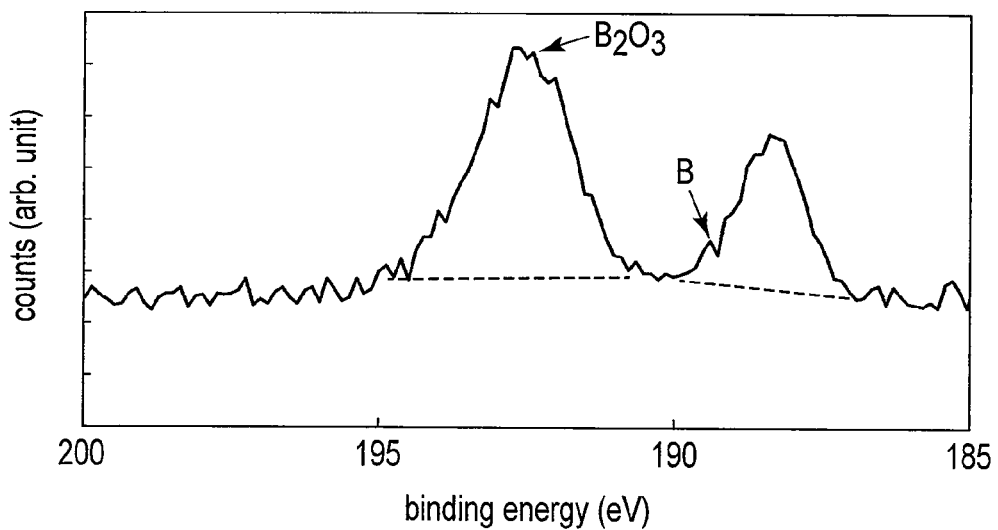
F I G. 10

US 8,987,007 B2

METHOD OF MANUFACTURING A SEMICONDUCTOR DEVICE HAVING A MAGNETIC FILM USING PLASMA ETCHING

CROSS-REFERENCE TO RELATED APPLICATIONS

This application is based upon and claims the benefit of priority from Japanese Patent Application No. 2012-208670, filed Sep. 21, 2012, the entire contents of which are incorporated herein by reference.

FIELD

Embodiments described herein relate generally to a method for manufacturing a semiconductor device.

BACKGROUND

In recent years, more and more attention has been paid to magnetic random access memories (MRAMs) that utilize magnetoresistive effects, as next-generation solid nonvolatile memories which have large capacities and which can perform fast reads and writes and low-power-consumption operations.

MRAM comprises, for example, magnetoresistive elements with ferromagnetic tunnel junctions as storage elements. The magnetoresistive element with a ferromagnetic tunnel junction is also referred to as a MTJ (Magnetic Tunnel Junction) element.

The MTJ element has a three-layer stacked structure comprising a storage layer with a variable magnetization direction, a tunnel barrier layer, and a reference layer that maintains a predetermined magnetization direction. MTJ elements with a four-layer stacked structure including a magnetic field adjustment layer provided on the reference layer are also known.

The magnetic field adjustment layer reduces a magnetostatic leakage field from the reference layer. The magnetic field adjustment layer is, for example, a CoPt (cobalt platinum alloy) layer, the reference layer is, for example, a FeCoB (boron-containing cobalt iron alloy) layer.

When the CoPt layer and the FeCoB layer are processed by well-known process (for example, RIE process or IBE process), conductive etching residue may adhere to sidewalls of the storage layer, the tunnel barrier layer, and the reference layer. The etching residue forms a leakage path between the storage layer and the reference layer. This increases the amount of leakage current between the storage layer and the reference layer.

BRIEF DESCRIPTION OF THE DRAWINGS

FIG. 1 is a cross-sectional view illustrating a method for manufacturing a semiconductor device according to an embodiment;

FIG. 2 is a cross-sectional view showing the method for manufacturing the semiconductor device of the embodiment following FIG. 1;

FIG. 3 is a cross-sectional view showing the method for manufacturing the semiconductor device of the embodiment following FIG. 2;

FIG. 4 is a cross-sectional view showing the method for manufacturing the semiconductor device of the embodiment following FIG. 3;

FIG. 5 is a cross-sectional view showing the method for manufacturing the semiconductor device of the embodiment following FIG. 4;

FIG. 6 is a cross-sectional view showing the method for manufacturing the semiconductor device of the embodiment following FIG. 5;

FIG. 7 is a diagram schematically showing a plasma etching apparatus for performing a plasma etching method according to an embodiment;

FIG. 8 is a cross-sectional view illustrating etching residue resulting from IBE process or an RIE process;

FIG. 9 is a diagram showing a result of measurement of etching rate of CoFeB compound/CoPt compound with varying flow ratio between $CO_2$ and $H_2$; and FIG. 10 is a diagram showing a result of analysis, by fluorescent X-ray photoemission spectroscopy (XPS), of a COFeB compound film after a plasma etching using $CO_2$ and $H_2$.

DETAILED DESCRIPTION

An embodiment will be described below with reference to the drawings.

In general, according to one embodiment, a method for manufacturing a semiconductor device is disclosed. The method includes forming a first magnetic film containing boron, forming a second magnetic film free from boron, above the first magnetic film. The method further includes selectively etching the second magnetic film with respect to the first magnetic film using plasma of etching gas which contains oxygen and hydrogen and which is free from halogen.

FIG. 1 to FIG. 6 are cross-sectional views illustrating a method for manufacturing a semiconductor device according to an embodiment. The embodiment will be described taking MRAM as an example of the semiconductor device.

[FIG. 1]

An interlayer insulating film 1 is formed on a silicon wafer (semiconductor substrate) that is not shown in the drawings. A select transistor and the like (not shown in the drawings) are formed on a surface of the silicon wafer. The select transistor is an element for selecting an MTJ element.

Next, a lower electrode 2, a storage layer 3, a tunnel barrier layer 4, a reference layer 5, a nonmagnetic layer 6, a magnetic field adjustment layer 7, an upper electrode 8, and a conductive film 9 to be a metal hard mask are consecutively formed on the interlayer insulating film 1 by sputtering method. Thereafter, a resist pattern 10 is formed on the conductive film 9.

The embodiment uses a FeCoB layer (first magnetic layer) as the reference layer 5 and a CoPt layer (second magnetic layer) as the magnetic field adjustment layer 7, a Ta layer is used as the nonmagnetic layer 6. A W layer may be used instead of the Ta layer.

The lower electrode 2 is, for example, a Pt layer, an Ir layer, or a Ru layer. The storage layer 3 is, for example, a FeCoB layer. The tunnel barrier layer 4 includes, for example, an MgO layer. The upper electrode 8 is, for example, a Pt layer, an Ir layer, or a Ru layer. The conductive layer 9 is, for example, a Ta film, a Ti film, a W film, a TaN film, or a TiN film.

The nonmagnetic layer 6 has a heat resistance for suppressing mutual diffusion of the reference layer 5 and the magnetic field adjustment layer 7 by a heat process, and has a function of controlling a crystal orientation at the time of forming the magnetic field adjustment layer 7.

A thickness of the nonmagnetic layer 6 is, for example, 5 nm or less. This is because an increased thickness of the nonmagnetic layer 6 increases the distance between the magnetic field adjustment layer 7 and the storage layer 3, reducing a magnetic field applied to the storage layer 3 by the magnetic field adjustment layer 7.

The magnetic field adjustment layer 7 reduces a magnetostatic leakage field generated from the reference layer 5. This reduces or adjusts a shift of magnetic switching field of the storage layer 3 caused by the magnetostatic leakage field.

The magnetic field adjustment layer 7 is located farther from the storage layer 3 than the reference layer 5. Thus, to allow the magnetic field adjustment layer 7 to correct a magnetostatic leakage field applied to the storage layer 3, the thickness of the magnetic field adjustment layer 7 or the magnitude of saturation magnetization of the magnetic field adjustment layer 7 is set larger than that of the reference layer 5. For example, if a FeCoB layer with a thickness of about 3 nm is used as the reference layer 5, a CoPt layer with a thickness of about 40 nm is used as the magnetic field adjustment layer 7, which provides saturation magnetization as about three times as large as the reference layer 5.

The magnetic field adjustment layer 7 generally comprises following (1) a disordered alloy, (2) an artificial lattice, (3) a ferrimagnetic substance, or a magnetic material formed by combining any of (1), (2), and (3).

(1) Disordered Alloy

A metal using cobalt (Co) as a main component, and containing at least one element of chromium (Cr), tantalum (Ta), niobium (Nb), vanadium (V), tungsten (W), hafnium (Hf), titanium (Ti), zirconium (Zr), platinum (Pt), palladium (Pd), iron (Fe), and nickel (Ni). For example, the disordered alloy is a CoCr alloy, a CoPt alloy, a CoCrTa alloy, a CoCrPt alloy, a CoCrPtTa alloy, or a CoCrNb alloy. For those alloys, magnetic anisotropy energy density and saturation magnetization can be controlled by increasing the rate of nonmagnetic element.

(2) Artificial Lattice

A stacked film in which at least one of iron (Fe), cobalt (Co), and nickel (Ni) or an alloy containing one of these elements and one of chromium (Cr), platinum (Pt), palladium (Pd), iridium (Ir), rhodium (Rh), ruthenium (Ru), osmium (Os), rhenium (Re), gold (Au), and copper (Cu) or an alloy containing one of these elements are alternately stacked. For example, the artificial lattice is a Co/Pt artificial lattice, a Co/Pd artificial lattice, a CoCr/Pt artificial lattice, a Co/Ru artificial lattice, a Co/Os artificial lattice, a Co/Au artificial lattice, a Ni/Cu artificial lattice. For the artificial lattices, the magnetic anisotropy energy density and the saturation magnetization controlled by adding an element to the magnetic layer or by adjusting the film thickness ratio of the magnetic layer and the nonmagnetic layer.

(3) Ferrimagnetic Substance

A ferrimagnetic substance comprising an alloy of a rare earth metal and a transition metal. An example of the ferrimagnetic substance is an amorphous alloy containing terbium (Tb), dysprosium (Dy), or gadolinium (Gd), and at least one of the transition metal elements. For example, the amorphous alloy is TbFe, TbCo, TbFeCo, DyTbFeCo, GdTbCo. For these alloys, the magnetic anisotropy energy density and the saturation magnetization can be controlled by adjusting the composition ratio.

As described above, various materials can be used as the magnetic field adjustment layer 7. However, the embodiment will be described in conjunction with the use of the CoPt layer as the magnetic field adjustment layer 7 as described above.

[FIG. 2]

The conductive film 9 is etched by RIE (Reactive Ion Etching) process by using the resist pattern 10 as a mask to transfer a pattern of the resist pattern to the metal hard mask 9. After that the resist pattern 10 is removed.

[FIG. 3]

The upper electrode 8 is etched by IBE (Ion Beam Etching) process into a predetermined shape using the metal hard mask 9 as a mask, and then the magnetic field adjustment layer 7 is etched down to the middle thereof by the IBE process using the metal hard mask 9 as a mask.

[FIG. 4]

The remaining part of the magnetic field adjustment layer 7 and the underlying nonmagnetic layer 6 are etched by plasma etching method using an etching gas which contains carbon dioxide ($CO_2$) and hydrogen ($H_2$) and which is free from halogen-based gas, by using the metal hard mask 9 as a mask. The use of the plasma etching method according to the embodiment allows the etching to be stopped at the reference layer 5. That is, the magnetic field adjustment layer 7 and the nonmagnetic layer 6 can be selectively etched with respect to the reference layer 5.

The inventor prepared a wafer comprising a thin film of $Co_{50}Fe_{50}B$ (the numerical values of Co and Fe are composition ratio in terms of the percentages of the Co and Fe) and a thin film of $Co_{50}Pt_{50}$ (the numerical values are composition ratio in terms of the percentages) formed on the thin film of $Co_{50}Fe_{50}B$, and measured the etching rate with varying a flow ratio of $CO_2$ and $H_2$. The result is shown in FIG. 9. As shown in FIG. 9, it is found that when the flow ratio of $CO_2/(CO_2+H_2)$ exceeds a certain value, an etching selectivity of CoPt with respect to $Co_{50}Fe_{50}B$ (hereinafter simply referred to as the selectivity) increases, and when the flow ratio $CO_2/(CO_2+H_2)$ is 25% or more, the selectivity is sufficiently large.

When the element composition of a surface of the $Co_{50}Fe_{50}B$ film after being subjected to the plasma etching is analyzed by X-ray photoemission spectroscopy (XPS), as shown in FIG. 10, as the selectivity is improved, an increasing of the peak resulting from $B_2O_3$ at the vicinity of 192.8 eV compared to that of B at the vicinity of 189.6 eV (B1s narrow peak) is observed, and it is found that the oxygen composition ratio of the $Co_{50}Fe_{50}B$ film rapidly increases. Therefore, it is inferred that, although the $Co_{50}Pt_{50}$ film free from B has an approximately constant etching rate, boron oxide ($B_2O_3$) having a low etching yield is formed in the $CO_{50}Fe_{50}B$ film, and etching rate of the $CO_{50}Fe_{50}B$ film is reduced, which thus results in improving the selectivity.

It can be see from the above that the boron oxide on the $Co_{50}Pt_{50}$ film or in the $Co_{50}Pt_{50}$ film improves the selectivity, so that when the boron oxide is decreased during the etching of the $Co_{50}Pt_{50}$ film, the improvement of the selectivity may not be obtained. One factor of the boron oxide decreasing is halogen included in a source gas for etching the $Co_{50}Pt_{50}$ film, since halogen has a strong reactivity, the halogen in the source gas may be reacted with the boron oxide, resulting in removing the boron oxide from the $Co_{50}Pt_{50}$ film.

In order to prevent the above-mentioned boron oxide removing, the present embodiment employs the plasma etching using etching gas which contains oxygen and hydrogen and which is free from halogen for etching the remaining part of the magnetic field adjustment layer 7.

The selectivity of the present embodiment is achieved by oxidation action by oxygen contained in $CO_2$ and reduction action by hydrogen, thus it is considered that the flow ratio between oxygen and hydrogen is a main cause of the rapid increase of the selectivity.

Furthermore, the above-described mechanism clearly indicates that CoFeB does not depend on the composition ratio between Co and Fe. Additionally, any of the above-described magnetic films other than CoPt, such as a platinum manganese alloy (PtMn), a cobalt iron alloy (CoFe), and a nickel iron alloy (NiFe) can be selectively etched with respect to CoFeB, thus allowing an MTJ element to be similarly formed.

Moreover, the source gas for oxygen is not limited to $CO_2$, and for example, carbon oxide (CO) may be used. The source gas for hydrogen is also not limited to $H_2$.

FIG. 7 is a diagram schematically showing an example of a plasma etching apparatus 30 configured to carry out the plasma etching method according to the embodiment.

The plasma etching apparatus 30 comprises a plasma processing chamber 31 for performing etching with introducing the etching gas. The inside of the plasma processing chamber 31 is evacuated by a vacuum pump or the like (not shown in the drawings) and can thus be maintained at a desired degree of vacuum.

A pipe 32 is provided on an upper wall (ceiling) of the plasma processing chamber 31 for introducing source gas (etching gas) of hydrogen ($H_2$) and carbon dioxide ($CO_2$) into the plasma processing chamber 31. A shower plate 33 is provided in an inner upper portion (ceiling side) of the plasma processing chamber 31. The shower plate 33 is a mechanism configured to evenly supply the etching gas to a silicon wafer 41. A high-frequency power supply 34 for plasma excitation is connected to the shower plate 33.

A susceptor 35 is provided in the plasma processing chamber 31 below the shower plate 33 so that the silicon wafer 41 can be placed on the susceptor 35. The susceptor 35 is connected to a bias high-frequency power supply 36 related for drawing ions from plasma.

The plasma processing chamber 31 is connected to a pressure gauge 38 via a pipe 37 so as to allow the pressure in the plasma processing chamber 31 to be monitored.

Etching of the MTJ stacked film (magnetic field adjustment layer 7, nonmagnetic layer 6) using the plasma etching apparatus 30 is carried out as described below.

That is, while the plasma processing chamber 31 is evacuated, $CO_2$ and $H_2$ are introduced into the plasma processing chamber 31 via the pipe 32 at flow rates of, for example, 80 SCCM and 240 SCCM, respectively (i.e., flow ratio $CO_2/(CO_2+H_2)=25\%$), pressure in the plasma processing chamber 31 is measured by the pressure gauge 37, and the pressure is maintained at 1.33 Pa for example, and while the shower plate 33 is applied with power, for example 300 W, by the high-frequency power supply 34, to generate the plasma of $CO_2$ and $H_2$, the susceptor 35 is applied with power, for example 500 W, by the bias high-frequency power supply 35, to draw ions (oxygen ions, hydrogen ions) from the plasma into the susceptor 35, thereby the MTJ stacked film is etched for about 30 seconds for instance.

According to the present embodiment, the magnetic field adjustment layer 7 is etched to down to the middle thereof by the IBE process as shown in FIG. 3, and subsequently, the magnetic field adjustment layer 7 is etched by the plasma etching method of the embodiment as shown in FIG. 4, however the whole of magnetic field adjustment layer 7 may be etched by the plasma etching method of the embodiment without using the IBE process.

In general, the IBE process is more anisotropic than the plasma etching method of the embodiment. Thus, when etching by the IBE process (FIG. 3) is followed by etching by the plasma etching method of the embodiment (FIG. 4), the magnetic field adjustment layer 7 having sidewalls with angle closer to the right angle can be easily formed.

[FIG. 5]

The reference layer 5 is etched by the IBE process. Resultant etching residue 11 adheres to sidewalls of the reference layer 5. The etching residue 11 contains the magnetic material of the reference layer 5 and are thus conductive.

[FIG. 6]

A sidewall insulating film 12 covering the sidewalls of the magnetic field adjustment layer 7, the nonmagnetic layer 6, and the reference layer 5 is formed by a well-known process, thereafter, the tunnel barrier layer 4 and the storage layer 3 are etched by RIE process or the IBE process by using the metal hard mask 9 and the sidewall insulating film 12 as a mask.

Resultant etching residue 13 adheres to sidewalls of the storage layer 3. The etching residue 13 contains the magnetic material of the storage layer 3 and are thus conductive.

The tunnel barrier layer 4 and the sidewall insulating film 12 are interposed between the etching residue 13 adhered on the sidewalls of the storage layer 3 and the etching residues 11 adhered on the sidewalls of the reference layer 5. Thus, the generated etching residues 11 and 13 are prevented from electrically connecting the storage layer 3 and the reference layer 5. This suppresses an increase in the amount of leakage current between the storage layer 3 and the reference layer 5.

Thereafter, the known steps such as the step of processing the lower electrode 2 into a predetermined shape are performed, thus completing MRAM.

As described above, the plasma etching method of the embodiment allows the etching to be stopped at the reference layer 5 (FIG. 4).

Here, the magnetic field adjustment layer 7 is thicker than the reference layer 5. For example, the magnetic field adjustment layer 7 is about 40 nm in thickness, and the reference layer 5 is about 3 nm in thickness. The magnetic field adjustment layer 7 is at least 10 times as thick as the reference layer 5. The reason why the magnetic field adjustment layer 7 is set thicker than the reference layer 5 is as described above.

Since the magnetic field adjustment layer 7 is thick, etching the magnetic field adjustment layer 7 takes a long time. Thus, when the magnetic field adjustment layer 7 is etched by only IBE process, a large in-plane variation occurs as the IBE process is low in etching selectivity. The reason why high etching selectivity is not achieved is that the IBE process is physical etching based on sputtering of Ar ions or the like.

The large in-plane variation of the etching may cause the reference layer 5 and the tunnel barrier layer 4 to be etched, which results in generating conductive etching residue 14, as shown in FIG. 8, for example.

The generated etching residue 14 adheres to the sidewalls of the reference layer 5 and the tunnel barrier layer 4 to electrically connect the reference layer 5 and the storage layer 3. The reference layer 5 and the storage layer 3 originally need to be insulated by the tunnel barrier layer 4. However, the etching residue 14 reduces the insulation between the storage layer 3 and the tunnel barrier layer 4. As a result, the use of the IBE process causes the etching residue 14 to serve as a leakage path, increasing the amount of leakage current between the reference layer 5 and the storage layer 3.

When the magnetic field adjustment layer 7 is etched down to the middle thereof by the IBE process (FIG. 3), and the magnetic field adjustment layer 7 and the nonmagnetic layer 6 are etched by the plasma etching method of the embodiment (FIG. 4), the etching is stopped at the reference layer 5.

The in-plane variation of the etching may occur during the IBE process. However the etching is stopped at the reference layer 5 as described above, the in-plane variation of the etching is turn into sufficiently small when the etching of the magnetic field adjustment layer 7 and the etching of the nonmagnetic layer 6 are finished. Thereby, the conductive etching residue, which increases the amount of leakage current between the storage layer 3 and the reference layer 5, is suppressed from being generated.

The use of the RIE process instead of the plasma etching method of the present embodiment allows the selectivity to be higher than the use of the IBE process. However, even though the RIE process is used, it is difficult to suppress the increasing of the leakage current due to the in-plane variation of the etching.

Even in the step of the embodiment shown in FIG. 4, the etching residue (not shown in the drawings) is generated on the sidewalls of the magnetic field adjustment layer 7 and the nonmagnetic layer 6, and then, the reference layer 5 comes into contact with the magnetic field adjustment layer 7 and the nonmagnetic layer 6 via the etching residue. However, the reference layer 5, the magnetic field adjustment layer 7, and the nonmagnetic layer 6, which contact one another, are originally conductors, and thus, possible etching residue (leakage path) poses no problem.

Though the etching of the reference layer 5 is performed by using the IBE process, the in-plane variation of the etching after the etching of the reference layer 5 is small, because the reference layer 5 is thinner than the magnetic field adjustment layer 7, and the in-plane variation of the etching after the etchings of the magnetic field adjustment layer 7 and the nonmagnetic layer 6 is sufficiently small. Thereby, the conductive etching residue, which is generated when the reference layer 5 and the tunnel barrier layer 4 are etched without stopping at an interface of those layers, and which increases the leakage current between the storage layer 3 and the reference layer 5, is suppressed from being generated.

As described above, the embodiment can suppress an increase in the amount of leakage current from the MTJ element (magnetoresistive element), thus restraining the element from malfunctioning.

The present invention is not limited to the above-described embodiment.

For example, the above-described embodiment for the stacked film (stack) of the reference layer 5, the nonmagnetic layer 6, and the magnetic field adjustment layer 7 focuses on the selective etching of the nonmagnetic layer 6 and the magnetic field adjustment layer 7 with respect to the reference layer 5, however, the selective etching using the plasma etching method of the present embodiment is not limited to the above stacked film. The selective etching of the present embodiment is applicable, without particular limitation, to any stacked film containing a first magnetic film including boron and a second magnetic film formed on the first magnetic film and free from boron. Furthermore, the selective etching using the plasma etching method of the embodiment is applicable to semiconductor devices other than MRAMs.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for manufacturing a semiconductor device comprising:
   forming a first magnetic film containing boron;
   forming a second magnetic film free from boron, above the first magnetic film; and
   selectively etching the second magnetic film with respect to the first magnetic film using plasma of etching gas which contains oxygen and hydrogen and which is free from halogen,
   wherein $B_2O_3$ is formed in the first magnetic film after the second magnetic film is selectively etched by using the plasma.

2. The method according to claim 1, wherein $CO_2$ is used as a source of the oxygen, and $H_2$ is used as a source of the hydrogen.

3. The method according to claim 2, wherein a flow ratio $CO_2/(CO_2+H_2)$ is 25% or more.

4. The method according to claim 1, wherein the first magnetic film constitutes a reference layer of a magnetoresistive element, and the second magnetic film constitutes a magnetic field adjustment layer of the magnetoresistive element.

5. The method according to claim 4, further comprising:
   forming a storage layer and a tunnel barrier layer of the magnetoresistive element before forming the first magnetic film, the tunnel barrier layer is formed on the storage layer and the first magnetic film is formed on the tunnel barrier layer.

6. The method according to claim 5, further comprising:
   etching the first magnetic film after selectively etching the second magnetic film, forming an insulating film on side walls of the etched first and second magnetic films, and etching the tunnel barrier layer and the storage layer after forming the insulating film.

7. The method according to claim 1, further comprising: etching an upper portion of the second magnetic film by IBE (Ion Beam Etching) process before selectively etching the second magnetic film with respect to the first magnetic film.

8. The method according to claim 1, further comprising: forming a nonmagnetic layer on the first magnetic film, wherein the second magnetic film is formed on the nonmagnetic layer is selectively etched with respect to the first magnetic film using the plasma.

9. The method according to claim 1, further comprising: etching the first magnetic film by IBE process.

10. The method according to according to claim 1, wherein the second magnetic film is wholly etched using the plasma regarding a film thickness direction.

11. The method according to according to claim 1, wherein the first magnetic film comprises boron-containing cobalt iron alloy, and the second magnetic film comprises cobalt platinum alloy, platinum manganese alloy, cobalt iron alloy, or nickel iron alloy.

12. The method according to claim 5, wherein the first magnetic film comprises boron-containing cobalt platinum alloy, the second magnetic film comprises cobalt platinum alloy, platinum manganese alloy, cobalt iron alloy, or nickel iron alloy, the storage layer comprises boron-containing cobalt iron alloy, and the tunnel barrier layer comprises magnesium oxide.

13. The method according to claim 8, wherein the nonmagnetic layer comprises tantalum or tungsten.

14. The method according to claim 8, wherein the nonmagnetic layer has a thickness of 5 nm or less.

15. The method according to claim 1, wherein the second magnetic film is thicker than the first magnetic film.

16. The method according to claim 1, wherein the second magnetic film is at least 10 times as thick as the first magnetic film.

17. The method according to claim 4, wherein the second magnetic film has a larger saturation magnetization than the first magnetic film.

18. The method according to 1, wherein the first magnetic film and the second magnetic film are formed by sputtering method.

19. The method according to claim 5, wherein the storage layer, the tunnel barrier layer, the first magnetic film, and the second magnetic are formed by sputtering method.

* * * * *

UNITED STATES PATENT AND TRADEMARK OFFICE
CERTIFICATE OF CORRECTION

| | |
|---|---|
| PATENT NO. | : 8,987,007 B2 |
| APPLICATION NO. | : 14/026397 |
| DATED | : March 24, 2015 |
| INVENTOR(S) | : Tomioka |

It is certified that error appears in the above-identified patent and that said Letters Patent is hereby corrected as shown below:

In the Claims

Claim 11, column 8, line 44, change "The method according to according to claim 1," to --The method according to claim 1,--.

Signed and Sealed this
Eighteenth Day of August, 2015

Michelle K. Lee
*Director of the United States Patent and Trademark Office*